(12) United States Patent
Murakami

(10) Patent No.: US 6,548,106 B1
(45) Date of Patent: Apr. 15, 2003

(54) METHOD OF APPLYING CORROSION INHIBITOR TO PARTS MOUNTED CIRCUIT BOARD

(75) Inventor: Takehiko Murakami, Inagi (JP)

(73) Assignee: Minami Co., Ltd., Tokyo (JP)

( * ) Notice: Subject to any disclaimer, the term of this patent is extended or adjusted under 35 U.S.C. 154(b) by 228 days.

(21) Appl. No.: 09/610,393

(22) Filed: Jul. 5, 2000

(30) Foreign Application Priority Data

Aug. 27, 1999 (JP) .......................................... 11-241007

(51) Int. Cl.⁷ ................................................ B05D 5/12
(52) U.S. Cl. ........................ 427/96; 427/282; 101/127; 101/129
(58) Field of Search .......................... 427/96, 97, 282; 101/127, 129

(56) References Cited

U.S. PATENT DOCUMENTS

| | | | | |
|---|---|---|---|---|
| 4,678,531 A | * | 7/1987 | Metzger et al. | ............. 156/250 |
| 4,739,919 A | * | 4/1988 | Van Den Brekel et al. | ...... 228/180.1 |
| 5,232,651 A | * | 8/1993 | Okuno et al. | ................ 264/251 |
| 5,368,883 A | * | 11/1994 | Beaver | .......................... 427/96 |
| 5,740,730 A | * | 4/1998 | Thompson, Sr. | ............. 101/127 |
| 6,247,632 B1 | * | 6/2001 | Howell | ......................... 228/101 |
| 6,363,847 B1 | * | 4/2002 | Murakami | ................... 101/129 |

FOREIGN PATENT DOCUMENTS

WO    48117    * 12/1997

* cited by examiner

*Primary Examiner*—Brian K. Talbot
(74) *Attorney, Agent, or Firm*—William J. Sapone; R. Neil Sudol; Henry D. Coleman

(57) ABSTRACT

The invention greatly improves an efficiency of a whole parts mounting process. In a method of applying a corrosion inhibitor to a parts mounted circuit board, a recess portion surrounding a part of a circuit board in which the parts are already mounted is provided on a back surface, and a mask provided with a through hole for applying the corrosion inhibitor formed in a mesh shape is used in a portion corresponding to a position of parts on the circuit board to which the corrosion inhibitor is applied in the recess portion. Then, the mask is mounted on the circuit board and the corrosion inhibitor is pressed out from the through hole formed in a mesh shape by a squeegee in a screen printing apparatus so as to be applied.

3 Claims, 4 Drawing Sheets

METHOD OF APPLYING CORROSION INHIBITOR TO PARTS MOUNTED CIRCUIT BOARD

BACKGROUND OF THE INVENTION

1. Field of the Invention

The present invention relates to a method of applying a corrosion inhibitor to a parts mounted circuit board.

2. Description of the Prior Art

A corrosion inhibitor is finally applied to necessary parts on a printed circuit board on which parts are mounted. However, this application has been conventionally performed one by one by a manual operation. Further, since a mutual distance between the mounted parts is narrow, it is a significantly difficult operation to apply the corrosion inhibitor to only the necessary parts.

SUMMARY OF THE INVENTION

The present invention is made by taking the points mentioned above into consideration, and an object of the present invention is to provide a method of applying a corrosion inhibitor to a parts mounted circuit board in which an application of a corrosion inhibitor is performed by printing so as to apply the corrosion inhibitor to a large number of parts mounted circuit plate at one time, solve a troublesome in the case of manually applying to only the necessary parts and greatly improve an efficiency of a whole of the mounting process.

Therefore, in accordance with the present invention, there is provided a method of applying a corrosion inhibitor to a parts mounted circuit board, wherein a recess portion surroundings a part of a circuit board in which the parts are mounted is provided on a back surface, a mask having a through hole for applying the corrosion inhibitor formed in a mesh shape is used in a portion corresponding to that of parts on the circuit board to which the corrosion inhibitor is applied in the recess portion, and the corrosion inhibitor is applied by screen printing.

Further, as a means for forming the through hole for applying the corrosion inhibitor in a mesh shape, there is a method of punching a multiplicity of narrow holes by a suitable punching means such as an etching or the like and also a method of expanding a net on a through hole having a desired size.

DESCRIPTION OF THE PREFERRED EMBODIMENT

A description will be given below of an embodiment in accordance with the present invention with reference to the accompanying drawings.

Figure 1:
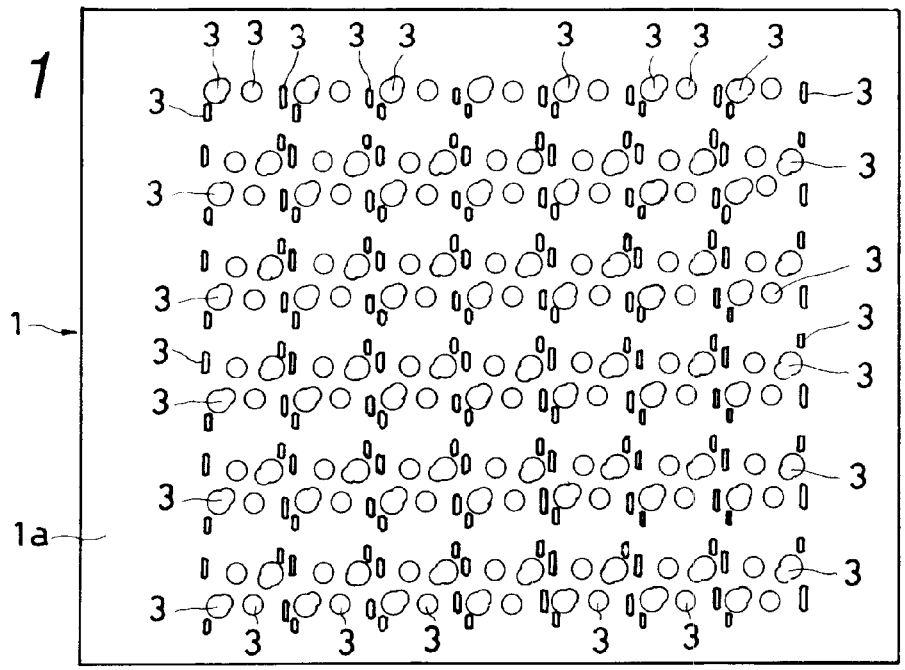
FIG. 1 is a schematic view of a front surface of a mask used in the present invention.
Figure 2:
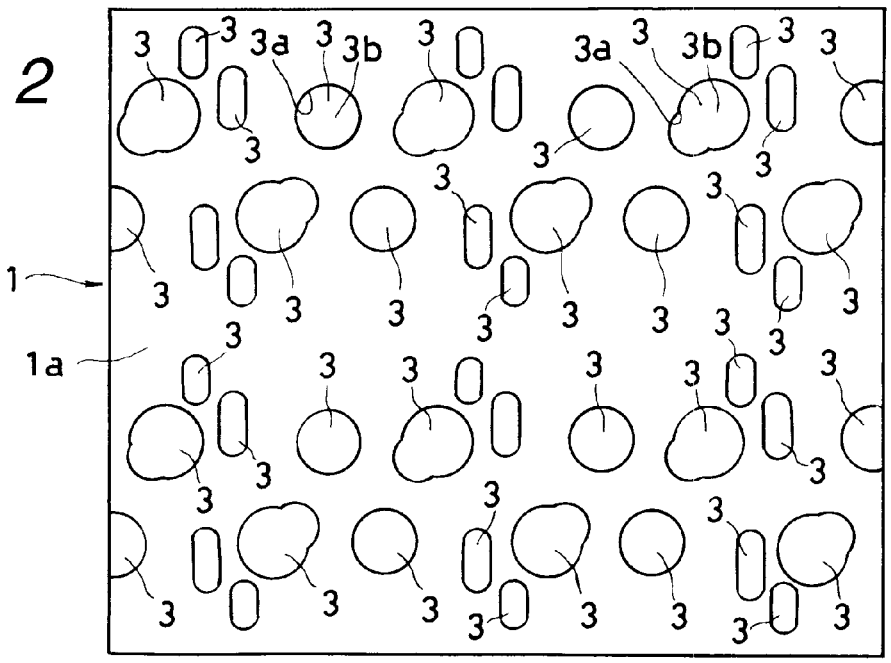
FIG. 2 is a partly enlarged view of the front surface side of the mask used in the present invention.
Figure 3:
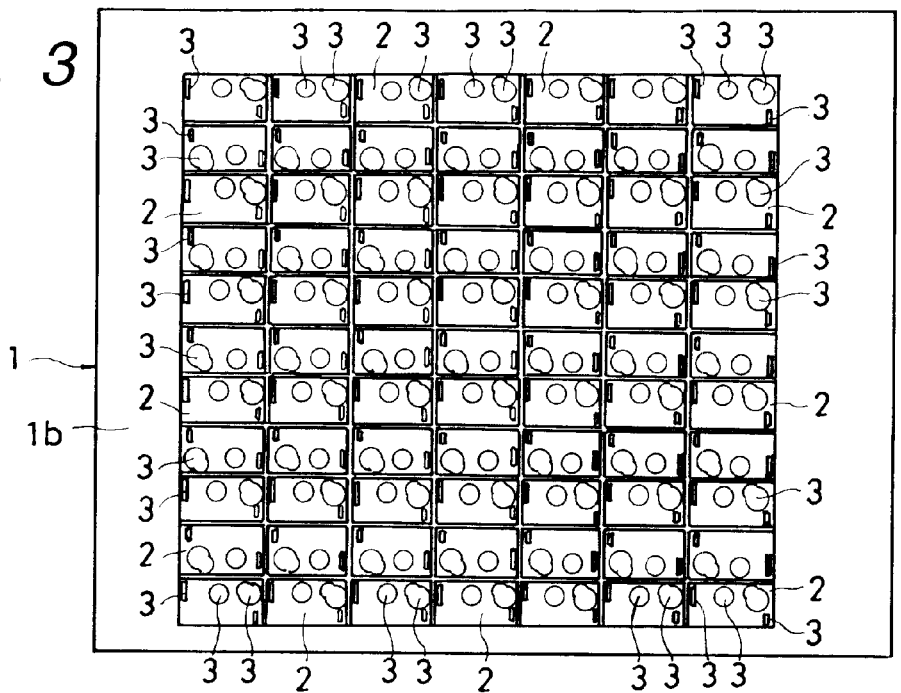
FIG. 3 is a schematic view of a back surface of the mask used in the present invention.
Figure 4:
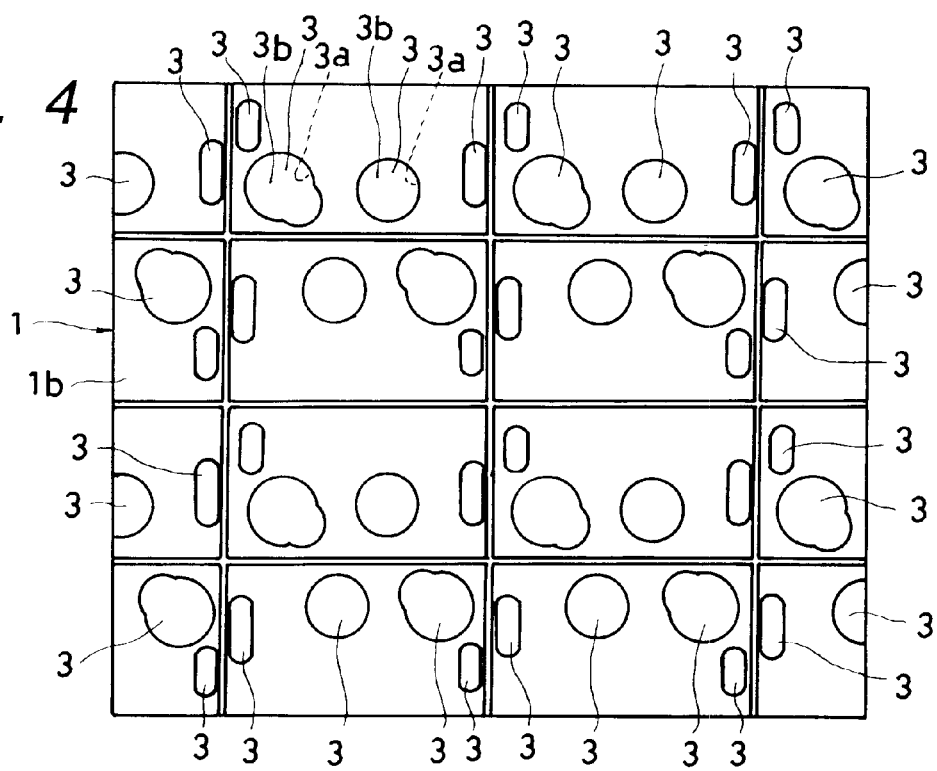
FIG. 4 is a partly enlarged view of the back surface side of the mask used in the present invention.
Figure 5:
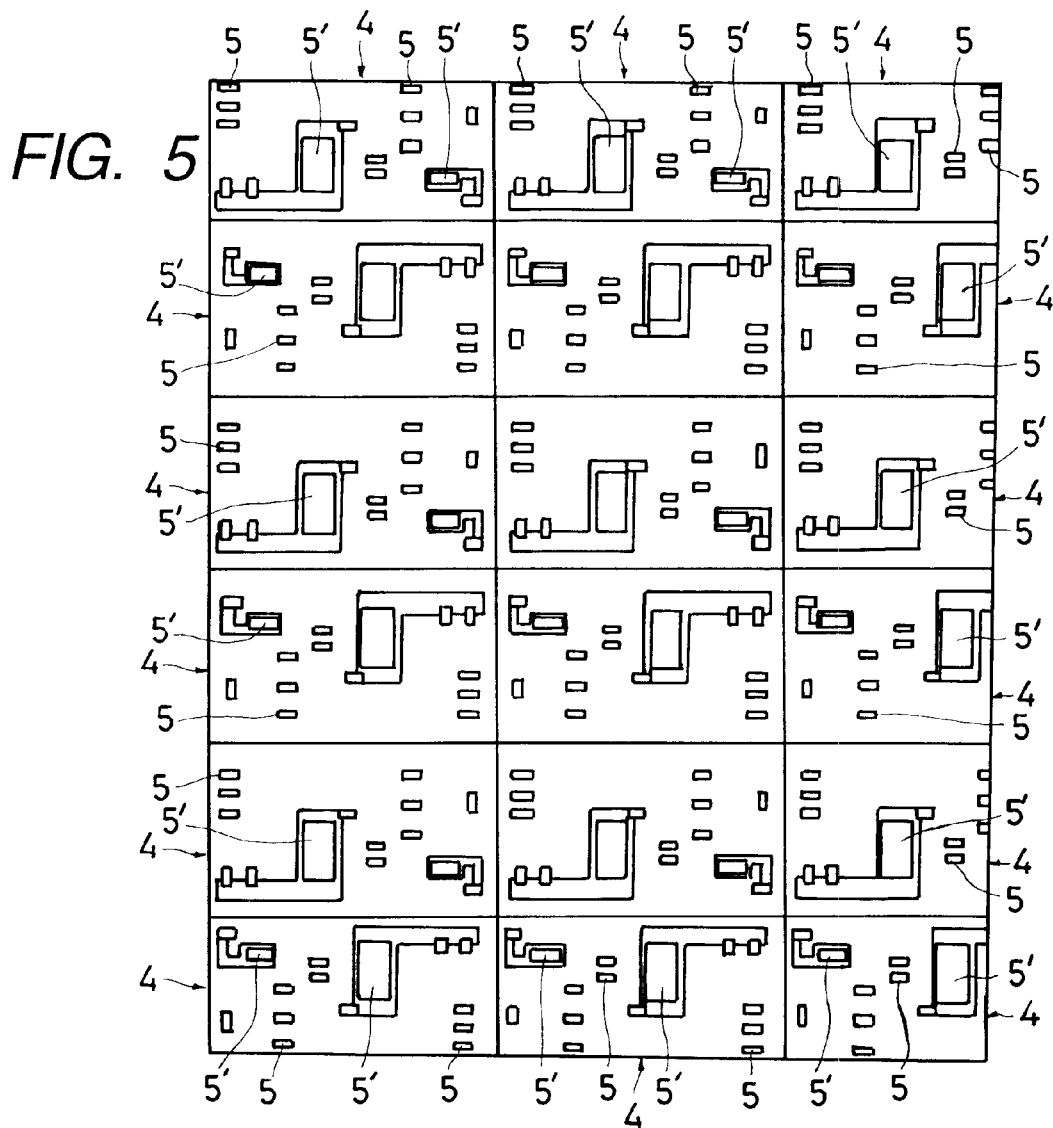
FIG. 5 is a plan view of a printed circuit board in a state prior to the application.
Figure 6:
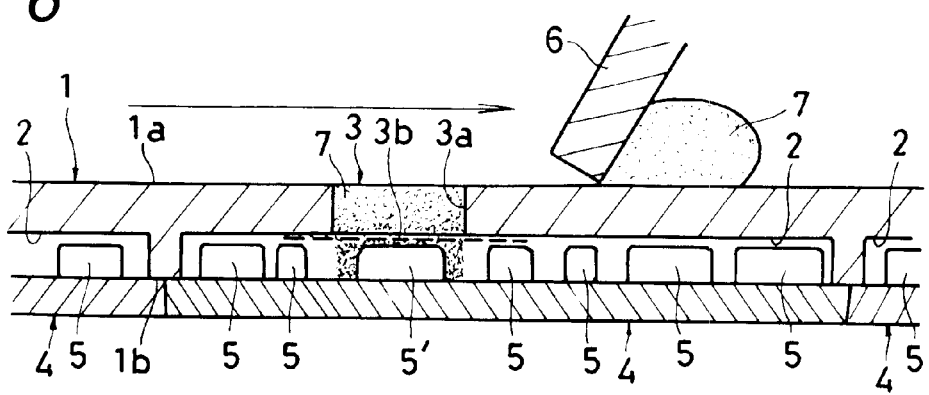
FIG. 6 is a schematic view for explaining an application process.
Figure 7:
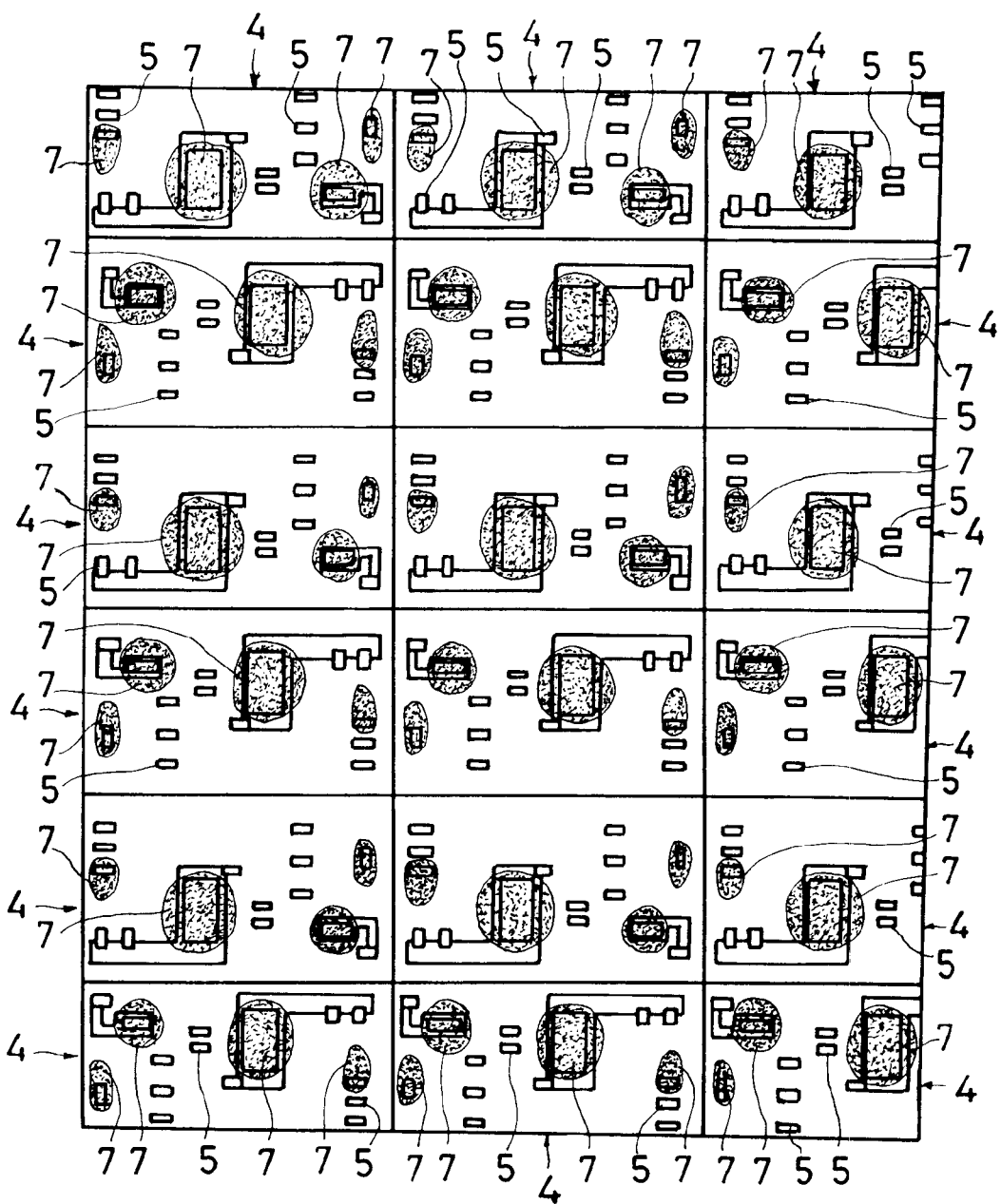
FIG. 7 is a schematic view for explaining the application process.

FIG. 1 is a schematic view of a front surface of a mask used in the present invention, FIG. 2 is a partly enlarged view of the front surface side of the mask, FIG. 3 is a schematic view of a back surface of the mask, FIG. 4 is a partly enlarged view of the back surface side of the mask, FIG. 5 is a plan view of a printed circuit board in a state prior to the application, and FIGS. 6 and 7 are schematic views for explaining an application process.

In the drawings, reference numeral 1 denotes a mask used in the present invention, reference numeral 1a denotes a front surface of the mask and reference numeral 1b denotes a back surface of the mask. Further, the mask 1 is provided with a recess portion 2 surrounding a portion of the circuit board in which the parts are mounted, on the back surface 1b thereof, and a through hole 3 for applying a corrosion inhibitor formed in a mesh shape is provided in a portion corresponding to a position in the recess portion 2 at which the corrosion inhibitor for the circuit board should be applied.

Further, in the present embodiment, the through hole 3 for applying the corrosion inhibitor formed in a mesh shape is formed by expanding a net 3b on a through hole 3a having a size slightly larger than that of a size of the whole part.

Reference numeral 4 denotes a circuit board in a state in which parts 5 are mounted. Reference numeral 5' denotes a part on which the corrosion inhibitor should be applied.

Reference numeral 6 denotes a squeegee in a screen printing apparatus, and,reference numeral 7 denotes a paste-like corrosion inhibitor.

In the present invention, as shown in FIG. 5, a large number of circuit boards 4 on which the parts 5 and 5' are mounted are arranged and set, then as shown in FIG. 6, the mask 1 is mounted thereon and the corrosion inhibitor 7 is pressed out by the squeegee 6, thereby applying the corrosion inhibitor 7 from the mesh-like through hole 3 to the parts 5' to which the corrosion inhibitor should be applied.

Further, since the net 3b having the narrow openings is expanded on the through hole 3 when pressing out the corrosion inhibitor 7 to the through hole 3 by the squeegee 6, the paste-like corrosion inhibitor 7 horizontally expands due to a resistance of the net and is not concentrated to one portion. When the corrosion inhibitor passes through the net openings, the separated corrosion inhibitors are connected to each other on a lower side of the net and wholly cover over the parts 5' in an even thickness.

FIG. 7 shows this state, the corrosion inhibitor 7 is accurately applied to each of the parts 5' on each of the printed circuit board 4.

In accordance with the present invention, the corrosion inhibitor can be,applied to a large number of parts mounted circuit board at one time, it is possible to dispense with trouble involved in when manually applying the corrosion inhibitor to only the necessary parts and it is possible to greatly improve an efficiency of a whole of the mounting process.

What is claimed is:

1. A method of applying a corrosion inhibitor to particular parts mounted on a circuit board, comprising the steps of:

providing a mask formed in a rear surface with a recess and formed in a given area with a plurality of through-holes extending to said recess, said through holes being provided with a mesh;

disposing said mask adjacent to the circuit board so that said recess surrounds said particular parts and so that said through-holes are aligned with said particular parts in said recess; and applying said corrosion inhibitor through said through-holes in said mask, into said recess, and onto said particular parts by screen printing.

2. A method according to claim 1, wherein said mesh is formed by a perforating step generating a multiplicity of fine holes.

3. A method according to claim 1, wherein said mesh is formed by expanding a net over said through-holes.

* * * * *